(12) United States Patent
Fischer et al.

(10) Patent No.: US 8,399,358 B2
(45) Date of Patent: Mar. 19, 2013

(54) ESTABLISHING A HYDROPHOBIC SURFACE OF SENSITIVE LOW-K DIELECTRICS OF MICROSTRUCTURE DEVICES BY IN SITU PLASMA TREATMENT

(75) Inventors: Daniel Fischer, Dresden (DE); Matthias Schaller, Moritzburg (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 360 days.

(21) Appl. No.: 12/786,829

(22) Filed: May 25, 2010

(65) Prior Publication Data

US 2010/0304566 A1 Dec. 2, 2010

(30) Foreign Application Priority Data

May 29, 2009 (DE) .......................... 10 2009 023 379

(51) Int. Cl.
*H01L 21/44* (2006.01)
(52) U.S. Cl. ................. 438/675; 438/789; 257/E21.277
(58) Field of Classification Search .................. 438/789; 257/E21.246, E21.264
See application file for complete search history.

(56) References Cited

U.S. PATENT DOCUMENTS

| 6,147,009 A * | 11/2000 | Grill et al. ...................... 438/780 |
| 7,250,370 B2 * | 7/2007 | Chang et al. .................. 438/694 |
| 2006/0057855 A1 | 3/2006 | Ramos et al. ................. 438/710 |
| 2006/0216952 A1 | 9/2006 | Bhanap et al. ................ 438/780 |
| 2008/0199977 A1 | 8/2008 | Weigel et al. ..................... 438/4 |

OTHER PUBLICATIONS

Translation of Official Communication from German Patent Office for German Patent Application No. 10 2009 023 379.2 dated Mar. 10, 2010.

* cited by examiner

*Primary Examiner* — Chandra Chaudhari

(74) *Attorney, Agent, or Firm* — Williams, Morgan & Amerson

(57) ABSTRACT

Silicon oxide based low-k dielectric materials may receive superior hydrophobic surface characteristics on the basis of a plasma treatment using hydrogen and carbon containing radicals. For this purpose, the surface of the low-k dielectric material may be exposed to these radicals, at least in one in situ process in combination with another reactive plasma ambient, for instance used for patterning the low-k dielectric material. Consequently, superior surface characteristics may be established or re-established without significantly contributing to product cycle time.

25 Claims, 6 Drawing Sheets

ESTABLISHING A HYDROPHOBIC SURFACE OF SENSITIVE LOW-K DIELECTRICS OF MICROSTRUCTURE DEVICES BY IN SITU PLASMA TREATMENT

BACKGROUND OF THE INVENTION

1. Field of the Invention

Generally, the present disclosure relates to microstructures, such as advanced integrated circuits, and, more particularly, to material systems including silicon oxide based dielectrics having a low dielectric constant.

2. Description of the Related Art

In the fabrication of modern microstructures, such as integrated circuits, there is a continuous drive to improve performance in view of operational behavior and diversity of functions integrated in a single microstructure device. For this purpose, there is an ongoing demand to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, frequently new materials may be required in order to not unduly offset any advantages that may be achieved by reducing the feature sizes of the individual components of microstructure devices, such as circuit elements and the like. For instance, upon shrinking the critical dimensions of transistors, thereby increasing the density of individual circuit elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area as typically two or more interconnections are required for each individual circuit element. Thus, a plurality of stacked "wiring" layers, also referred to as metallization layers, is usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like.

Advanced integrated circuits, including transistor elements having a critical dimension of 0.05 µm and even less, may, therefore, typically be operated at significantly increased current densities of up to several kA per cm' in the individual interconnect structures, despite the provision of a relatively large number of metallization layers, owing to the increased number of circuit elements per unit area. Consequently, well-established materials, such as aluminum, are being replaced by copper and copper alloys, i.e., materials with a significantly lower electrical resistivity and improved resistance to electromigration even at considerably higher current densities compared to aluminum.

The introduction of copper into the fabrication of microstructures and integrated circuits comes along with a plurality of severe problems residing in copper's characteristics to readily diffuse in silicon dioxide and other dielectric materials, as well as the fact that copper may not be readily patterned on the basis of well-established plasma assisted etch recipes. For example, based on conventional plasma assisted etch processes, copper may not substantially form any volatile etch byproducts such that the patterning of a continuous copper layer with a thickness that is appropriate for forming metal lines may not be compatible with presently available etch strategies. Consequently, the so-called damascene or inlaid process technique may typically be applied in which a dielectric material may be formed first and may be subsequently patterned in order to receive trenches and via openings, which may be subsequently filled with the copper-based material by using, for instance, electrochemical deposition techniques. Moreover, copper has a pronounced diffusivity in a plurality of dielectric materials, such as silicon dioxide based materials, which are frequently used as interlayer dielectric materials, thereby requiring the deposition of appropriate barrier materials prior to actually filling corresponding trenches and via openings with the copper-based material. Although silicon nitride and related materials may have excellent diffusion blocking capabilities, using silicon nitride as an interlayer dielectric material is less than desirable due to the moderately high dielectric constant, which may result in a non-acceptable performance degradation of the metallization system. Similarly, in sophisticated applications, the reduced distance of metal lines may require a new type of dielectric material in order to reduce signal propagation delay, cross-talking and the like, which are typically associated with a moderately high capacitive coupling between neighboring metal lines. For this reason, so-called low-k dielectric materials are increasingly being employed, which may generally have a dielectric constant of 3.0 or less, thereby maintaining the parasitic capacitance values in the metallization system at an acceptable level, even for the overall reduced dimensions in sophisticated applications.

Since silicon dioxide has been widely used in the fabrication of microstructure devices and integrated circuits, a plurality of modified silicon oxide based materials have been developed in recent years in order to provide dielectric materials with a reduced dielectric constant on the basis of precursor materials and process techniques that may be compatible with the overall manufacturing process for microstructure devices and integrated circuits. For instance, silicon oxide materials with a moderately high amount of carbon and hydrogen, for instance referred to as SICOH materials, have become a frequently used low-k dielectric material, which may be formed on the basis of a plurality of precursor materials, such as silane-based materials, in combination with ammonium and the like, which may be applied by chemical vapor deposition (CVD) techniques and the like. In other cases, spin-on glass (SOG) materials may be modified so as to contain a desired high fraction of carbon and hydrogen, thereby providing the desired low dielectric constant.

In still other sophisticated approaches, the dielectric constant of these materials may be even further reduced by further reducing the overall density of these materials, which may be accomplished by incorporating a plurality of cavities of nano dimensions, also referred to as pores, which may represent gas-filled or air-filled cavities, within the dielectric material, thereby obtaining a desired reduced dielectric constant. Although the permittivity of these dielectric materials may be reduced by incorporating carbon and forming a corresponding porous structure, which may result in a very increased surface area at interface regions connecting to other materials, the overall mechanical and chemical characteristics of these low-k and ultra low-k (ULK) materials may also be significantly altered and may result in additional problems during the processing of these materials.

For example, as discussed above, the dielectric material may typically have to be provided first and may be patterned so as to receive trenches and via openings, which may require the exposure of the sensitive low-k dielectric materials to various reactive process atmospheres. That is, the patterning of the dielectric material may typically involve the formation of an etch mask based on a resist material and the like followed by plasma assisted etch processes in order to form the trenches and via openings corresponding to the design rules of the device under consideration. Thereafter, cleaning processes may have to be performed in order to remove contaminants and other etch byproducts prior to depositing materials, such as conductive barrier materials and the like. Consequently, at least certain surface areas of the sensitive low-k dielectric materials may be exposed to plasma assisted processes, such as resist strip processes performed on the basis of an oxygen plasma, wet chemical reagents in the form of acids, aggressive bases, alcohols and the like, which may thus result in a certain degree of surface modification or damage. For instance, the low-k dielectric materials may typically be provided with a hydrophobic surface in order to avoid the incorporation of OH groups and the like, which may represent polarizable groups that may therefore respond to an electrical field, thereby significantly increasing the resulting permittivity of the surface portion of the material. Upon exposure of the hydrophobic surface to reactive atmospheres, such as plasma, aggressive wet chemical reagents and the like, the hydrocarbon groups of the hydrophobic surface area may be replaced by other groups and may finally result in the creation of silanol groups, which result in a significant increase of the dielectric constant at the surface area of the dielectric material. This surface modification or damaging may result in a significant modification of the dielectric behavior of the metallization system which may not be compatible with the performance requirements of sophisticated integrated circuits. Hence, great efforts are being made in providing silicon oxide based low-k dielectric materials while avoiding or at least reducing the surface modification during the patterning of the sensitive dielectric material. To this end, it has been suggested to selectively remove a damaged surface portion of the low-k dielectric materials on the basis of appropriate etch strategies so as to re-establish the desired hydrophobic surface characteristics. In this case, appropriate etch recipes may have to be applied without exposure of the resulting structure to any further aggressive process ambient in order to maintain the hydrophobic nature of the surface until the deposition of a conductive barrier material and the like. Additionally the material removal may result in an increase of the critical dimensions of the metal lines and vias, which may be undesirable in view of enhanced packing density, since the increased critical dimension may have to be taken into consideration when designing the metallization system under consideration.

In other approaches the hydrophobic nature may be re-established by performing a surface treatment after exposing the low-k dielectric material to the aggressive process ambient, which may be accomplished by using specific compounds. For example, U.S. Pat. No. 7,029,826 discloses a surface treatment of porous silica materials by exposing the damaged surface area to one or more compounds having the formula as follows: $R_3SINHSIR_3$, RXSICLY, RXCI(OH)Y, $R_3SIOSIR_3$, RXSI(OR)Y, $MPSI(HO)_{4-P}$, $RXSI(OCOCH_3)$ YR and combinations thereof, wherein X is an integer ranging from 1-3, Y is an integer ranging from 1-3 such that Y=4−X, P is an integer ranging from 2-3, each R is selected from hydrogen and a hydrophobic organic moiety, each M is an independently selected hydrophobic organic moiety, and R and M can be the same or different.

Although a surface treatment with chemical reagents as specified in this document may provide enhanced hydrophobic surface conditions of nanoporous silica dielectric materials, there is still room for further improvement, for instance with respect to enhancing overall process efficiency and the like.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for enhancing the surface characteristics of silicon oxide based low-k dielectric materials by re-establishing a hydrophobic surface structure which may be "damaged" by plasma assisted processes, such as plasma etching, resist stripping, plasma enhanced deposition processes and the like. In this respect, a hydrophobic surface is to be understood such that the amount of methyl groups is higher than an amount of polarizable functional groups, such as OH groups. The amount of functional groups and the type thereof may be efficiently determined by Fourier transformed infrared spectroscopy (FTIR). For this purpose, a plasma treatment may be performed in situ on the basis of an appropriate precursor gas, thereby initiating a reaction with dangling surface bonds of the "damaged" surface area in order to maintain or re-establish the desired hydrophobic nature of the exposed surface. Due to the in situ nature, i.e., the "repair" plasma ambient may be established in the same plasma-confining process environment as the "damaging" plasma ambient, a very efficient mechanism in terms of repair efficiency and overall manufacturing efficiency may be accomplished since the desired hydrophobic functional groups may be immediately bonded to the damaged surface area without requiring additional process reactors, transport activities and the like. Moreover, since the "repair" plasma ambient may be readily established in a plurality of conventional plasma reactors, such as plasma etch tools, plasma assisted deposition tools and the like, the mechanism of establishing or re-establishing the hydrophobic functional groups at the surface area may be performed at any appropriate stage of a plasma-based manufacturing process, such as an etch process, so that generally a significantly reduced degree of surface damage may be created, which may even be substantially completely re-established at a final phase or immediately after the preceding damaging plasma treatment. In some illustrative aspects disclosed herein, the repair plasma ambient may be created on the basis of hydrogen and carbon containing radicals, which may provide a significantly enhanced degree of flexibility in creating functional methyl groups due to the superior reactivity of the radicals in the plasma ambient. Consequently, compared to many conventional strategies in which surface repair reagents may be applied as liquids or as a vapor, the increased reactivity of the plasma radicals may result in a bonding of methyl groups to the silicon atoms, without requiring the replacement of a hydrogen atom of an OH group, thereby leaving an oxygen atom at the surface, as is the case in many conventional strategies. Moreover, due to the efficient plasma-based surface treatment, exposed surface areas of the sensitive low-k dielectric materials may be efficiently treated two or several times, for instance during a final phase of a corresponding plasma treatment, such as resist ashing and the like, thereby providing the low-k dielectric material with superior surface characteristics after such damaging plasma processes compared to conventional strategies based on liquids or vapors. Consequently, the desired low dielectric constant of surface portions of silicon and oxygen based low-k dielectric materials may be efficiently preserved or re-established with a significantly reduced overall process time compared to conventional approaches, thereby providing the possibility of introducing any additional surface treatments, thereby even further enhancing the final material characteristics without adding to additional process complexity. Moreover, in some illustrative aspects disclosed herein, the highly efficient in situ plasma treatment may be performed in combination with a treatment using a chemical having cross-linking capabilities, thereby providing superior chemical stability for the further processing of the sensitive low-k dielectric material.

An illustrative method disclosed herein comprises forming a silicon and oxygen containing dielectric material above a substrate of a microstructure device. The method further comprises establishing a first plasma ambient in a process environment that is configured to confine a plasma. Moreover, the method comprises exposing a surface portion of the silicon and oxygen containing dielectric material to a first type of radicals generated in the first plasma ambient. Additionally, a second plasma ambient is established in the process environment on the basis of hydrogen and carbon. Additionally, the method comprises exposing the surface portion of the silicon and oxygen containing dielectric material to a second type of radicals generated in the second plasma ambient, wherein the second type of radicals provides a hydrophobic surface structure on the surface portion.

A further illustrative method disclosed herein relates to forming a low-k dielectric material in a microstructure device. The method comprises forming a silicon and oxygen containing dielectric material above a substrate so as to have a dielectric constant of approximately 3.0 or less, wherein at least a portion of a surface of the silicon and oxygen containing dielectric material represents a hydrophobic surface. The method further comprises patterning the silicon and oxygen containing dielectric material by exposing at least a part of the silicon and oxygen containing dielectric material to a first type of radicals in a process environment that is configured to confine a plasma ambient. Additionally, the method comprises exposing an exposed surface area of the silicon and oxygen containing dielectric material to a second type of radicals in the process environment, wherein the second type of radicals generates a hydrophobic surface structure.

A still further illustrative method disclosed herein comprises forming a low-k dielectric material above a substrate of a semiconductor device, wherein the low-k dielectric material comprises silicon and oxygen. The method additionally comprises forming a trench in the low-k dielectric material by performing a plasma assisted etch process in a process chamber. The method further comprises generating hydrogen and carbon containing radicals in the process chamber so as to reduce the dielectric constant of exposed surface portions of the low-k dielectric material. Finally, the method comprises forming a metal line on the basis of the trench.

BRIEF DESCRIPTION OF THE DRAWINGS

The disclosure may be understood by reference to the following description taken in conjunction with the accompanying drawings, in which like reference numerals identify like elements, and in which.

Figure 1A:
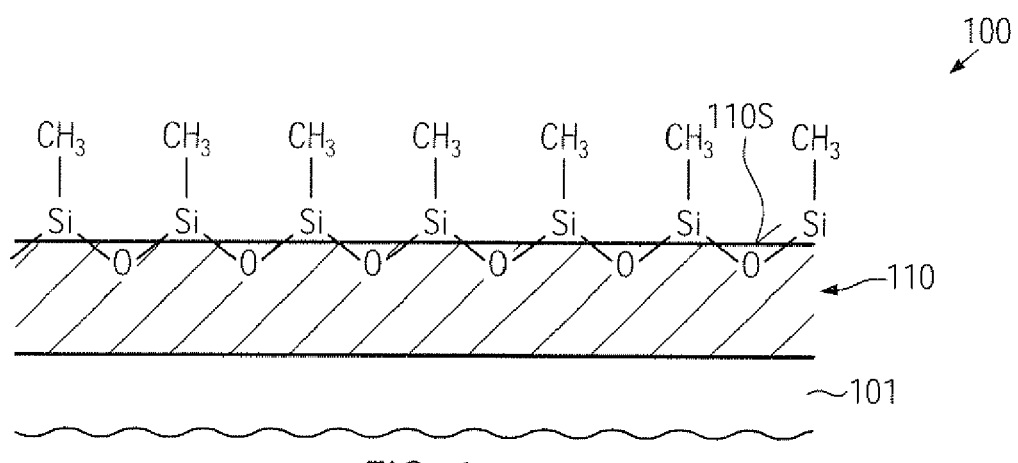
FIG. 1a schematically illustrates a cross-sectional view of a microstructure device including a silicon oxide based low-k dielectric material having a hydrophobic surface, i.e., a low-k surface area.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure provides techniques for obtaining a desired low-k dielectric constant at surface areas of silicon and oxygen based low-k dielectric materials after exposure thereof to reactive plasma processes, as may be used for patterning the low-k dielectric material, for depositing the low-k dielectric material and the like. For this purpose a modification of exposed surface areas of the sensitive low-k dielectric material may be treated on the basis of carbon and hydrogen containing radicals in order to form corresponding methyl groups at dangling surface bonds prior to exposing the modified surface to the ambient atmosphere. Consequently, a highly reactive process ambient may be established within the same process chamber in which the surface modification may be performed on the basis of a reactive plasma ambient, thereby providing very high efficiency in terms of overall throughput, since additional transport activities may be avoided. Furthermore, exposure to other species, such as oxygen of the ambient atmosphere, water and the like, may be substantially restricted. Consequently, the microstructure device may leave the corresponding process chamber with a hydrophobic surface having similar characteristics compared to the beginning of the reactive plasma process, such as a patterning process and the like. Consequently, the further processing may be continued on the basis of superior surface conditions while substantially not adding to additional cycle time, wherein, compared to conventional strategies using surface modifications based on liquids and vapors, in total, an increased throughput may be accomplished, while resources in terms of process equipment may be less demanding compared to the conventional strategies. Moreover, by using a carbon and hydrogen containing plasma ambient for establishing or re-establishing the desired hydrophobic surface characteristics, the surface treatment may be incorporated into any manufacturing stage in which an exposure to a plasma ambient may be required, such as resist stripping processes and the like. Consequently, exposed surface areas of the sensitive low-k dielectric material may be repeatedly treated on the basis of hydrogen and carbon containing radicals, substantially without causing increased cycle times.

Moreover, in some illustrative embodiments disclosed herein, the in situ plasma treatment may be performed in combination with a treatment for enhancing the chemical stability of the hydrophobic surface by supplying a chemical that has the capability of creating cross-links, wherein the corresponding treatment may be performed on the basis of a plasma ambient, a liquid, a vapor and the like. For this purpose, a wide variety of chemicals may be used, such as silane and derivates thereof, in combination with an appropriate functional group, such as a vinyl group and the like.

FIG. 1a schematically illustrates a cross-sectional view of a microstructure device 100 comprising a substrate 101, which may represent any appropriate carrier material for forming thereabove a low-k dielectric material layer 110, which may have to be processed on the basis of aggressive processes, such as plasma-based processes and the like. The dielectric layer 110 may comprise silicon and oxygen in combination with a carbon species and hydrogen in order to obtain a moderately low dielectric constant, as previously explained. Hence, in this respect, a low-k dielectric material is to be understood as a material having a dielectric constant of 3.0 or less. It should be appreciated that the dielectric constant may vary within the material layer 110, and, in particular, a surface area 110S may have a different dielectric constant compared to the lower lying material portions due to exposure to reactive process atmospheres, oxygen, water and the like. In the embodiment illustrated, the surface 110S may have a low dielectric constant value due to the hydrophobic nature, which is represented by methyl groups ($CH_3$) bonded to silicon surface atoms. As previously discussed, in sophisticated applications, a modification of the dielectric constant even of a small surface area may result in significant changes of the overall performance of the microstructure device 100. For instance, in one illustrative embodiment, the low-k dielectric material 110 may represent at least a portion of an interlayer dielectric material of a device level, a contact structure or a metallization system, which may comprise conductive regions, such as metal lines and the like, wherein an increased parasitic capacitance between neighboring conductive regions may result in increased signal propagation delay, cross-talking and the like, which may not be compatible with performance requirements of modern microstructure devices. For instance, in and above the substrate 101, a large number of circuit elements, such as transistors, capacitors and the like, may be formed in accordance with a specific circuit layout, thereby also requiring closely spaced interconnect structures in order to provide the required number of electric connections of the individual circuit elements without unduly consuming valuable chip area of the device 100. For example, corresponding circuit elements, such as field effect transistors, may be formed on the basis of critical dimensions of approximately 50 nm and less, wherein critical dimensions of approximately 100 nm and less may also have to be provided at least in some levels of a corresponding metallization system, as will be described later on.

The dielectric material 110 may be formed on the basis of any appropriate deposition technique, for instance by CVD techniques, possibly in the form of plasma assisted recipes based on a wide variety of appropriate precursor materials, such as TEOS (tetramethyl-oxysilane) and the like. In other cases, well-established spin-on techniques may be used in order to provide the material 110 in a low viscous state, followed by an appropriate treatment in the form of applying heat, radiation and the like in order to cure the material 110. As previously explained, frequently, the overall density of the material layer 110 may be even further reduced by incorporating voids and cavities of nano dimensions, which may be accomplished by incorporating appropriate solvents or other highly volatile byproducts, which may be driven out of the material 110, thereby resulting in a desired nano porous structure. In this manner, well-established precursor materials may be used on the basis of silicon, oxygen and carbon, while nevertheless obtaining k values of 2.7 and significantly less.

Figure 1B:
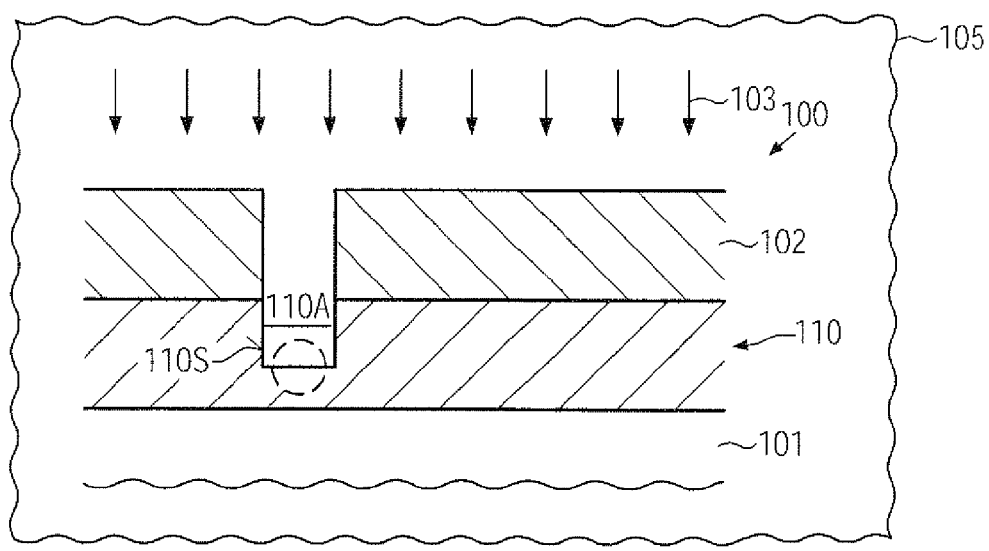
FIG. 1b schematically illustrates a cross-sectional view of the microstructure device in a further advanced manufacturing stage, i.e., during a patterning process based on a plasma ambient.

FIG. 1b schematically illustrates the microstructure device in a further advanced manufacturing stage in which a mask material 102 may be formed above the low-k dielectric material 110. In many applications, for instance forming metallization systems on the basis of the damascene or inlaid technique, the dielectric material may have to be patterned in order to form a corresponding opening 110A therein, which may have to be filled with an appropriate conductive material, as also previously explained. For this purpose, the etch mask 102 may be provided in the form of any appropriate material or material composition, for instance comprising resist material, hard mask material and the like. Furthermore, the patterning process typically comprises a plasma assisted etch process 103, which may be performed in an appropriate process environment 105, which may be provided in the form of a process chamber of a plasma assisted etch tool and the like. Generally, the process environment 105 is to be considered as a spatially restricted area that is appropriately configured to obtain and confine radicals on the basis of any appropriate etch chemistry. It should be appreciated that the process environment 105 may not necessarily include any hardware resources for establishing the radicals within the environment 105, but may receive these radicals from an externally provided plasma source. In other cases, the environment 105 may represent a process chamber or reactor including any required components for igniting a plasma and generating the desired radicals within the environment 105. For this purpose, a plurality of plasma assisted etch tools are available in the art. Consequently, the etch process 103 may be performed on the basis of any well-established process parameters, such as high frequency power for establishing a plasma ambient, the flow rate of any precursor materials and carrier gases, such as argon, helium and the like, which may assist in maintaining the desired plasma, an appropriate process pressure, a temperature of the substrate 101 and thus of the surface 110 and the like. Thus, during the process 103, the opening 110A may be formed, thereby creating an additional surface portion 110S, the characteristics of which may be substantially determined by the plasma assisted process 103, i.e., by any radicals interacting with the surface 110S, when the etch front advances into the material 110.

Figure 1C:
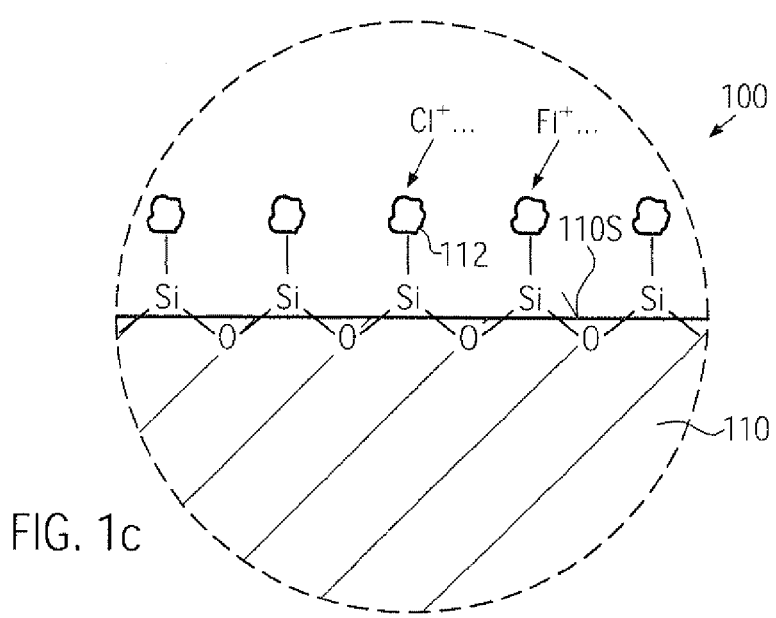
FIG. 1c schematically illustrates an enlarged view of an exposed surface portion that may be "damaged" or modified during the etch process of FIG. 1b.

FIG. 1c schematically illustrates an enlarged view of a portion of the surface 110S during and after the process 103. As illustrated, any radicals, for instance based on fluorine, chlorine and the like, may react with the methyl groups and may thus modify the surface structure, as indicated by 112. For example, the methyl groups may be entirely replaced by other functional groups or a part of the methyl groups may be replaced by other atoms or may remain in an unsaturated state, thereby representing a highly reactive surface, which may result in the formation of silanol groups when exposed to oxygen, water and the like. Consequently, the groups 112 during and after the plasma treatment 103 may be highly disadvantageous in view of chemical stability and in particular in view of the low-k dielectric value since the formation of silanol groups, which represent highly polarizable functional groups, may result in a significant increase of the dielectric constant at the surface 1105.

Figure 1D:
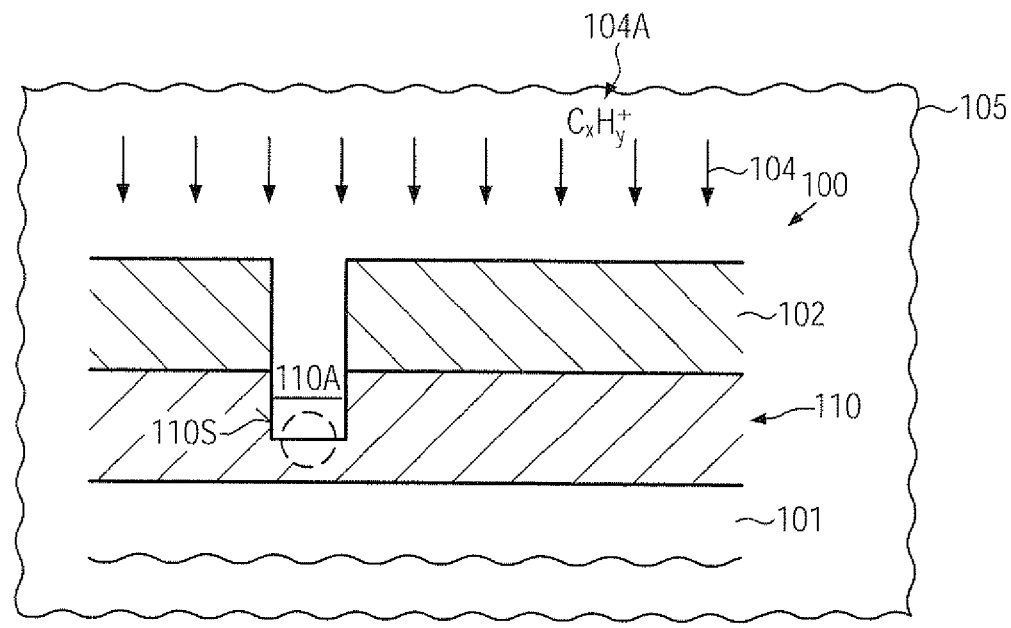
FIG. 1d schematically illustrates a cross-sectional view of the microstructure device during an in situ plasma treatment, for instance, based on carbon and hydrogen containing radicals in order to re-establish, at least to a certain degree, the hydrophobic nature of the previously modified surface portions, according to illustrative embodiments.

FIG. 1d schematically illustrates the microstructure device 100 when exposed to a further plasma ambient 104, which may also be established within the process environment 105 so that any additional transport activities may be avoided. In this respect, a transport activity is to be understood as placing the device 100 in a dedicated transport container and conveying the transport container to a further process chamber or process tool. On the other hand, a "tool internal" transport of substrates in a cluster tool without exposing the substrates to the clean room ambient may not be considered as a transport activity in the above-defined sense. The plasma ambient 104 for treating the exposed surface portions 1105 may comprise radicals 104A containing carbon and hydrogen, for instance of the general forms $C_xH_y$, such as methane radicals and the like. As discussed above, the plasma ambient 104 may thus provide superior conditions for reacting with the surface 1105, i.e., with the modified or missing functional groups in order to form a significant amount of methyl groups, which may thus provide a substantially hydrophobic surface nature.

Figure 1E:
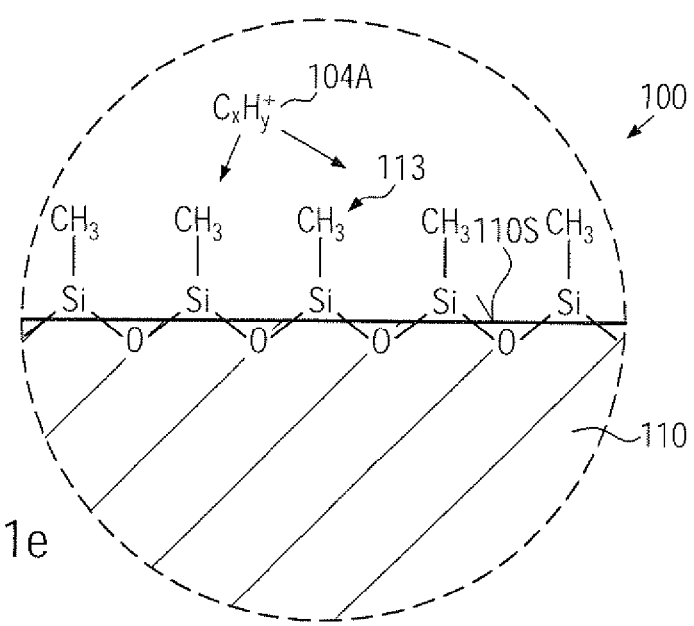
FIG. 1e schematically illustrates an enlarged view of exposed surface portions with a hydrophobic nature on the basis of methyl groups which may be bonded to silicon surface atoms, according to illustrative embodiments.

FIG. 1e schematically illustrates an enlarged view of a portion of the surface 1105, wherein a plurality of methyl groups 113 may be bonded to silicon surface atoms, thereby obtaining a desired hydrophobic nature, i.e., a surface saturated with non-polar functional groups, such as methyl groups. It should be appreciated that the plasma ambient 104 (FIG. 1d) may be established on the basis of a wide range of process parameters wherein typically parameters, such as temperature of the substrate 101, the pressure in the environment 105 and the like, may be substantially maintained in order to provide short transition times between the reactive ambient 103 (FIG. 1b) and the repairing plasma ambient 104. In this case, the radicals 104A may be generated at any appropriate phase within the process environment 105, for instance during the presence of any other reactive radicals, which may efficiently remove material of the layer 110, while, in other cases, at a final phase and after the actual etch phase, the radicals 104A may be generated or supplied to the environment 105.

It should be appreciated that in other illustrative embodiments the plasma treatment 103 of FIG. 1b may represent in other cases a plasma ambient for depositing at least a portion of the material 110, wherein at any appropriate phase of the deposition process, for instance at a final phase, the plasma treatment 104 may be applied in order to further enhance the overall surface characteristics of the material 110 as deposited. Consequently, an increased degree of flexibility in selecting appropriate plasma conditions during the deposition process may be available, since any undue damage or any less pronounced hydrophobic structure of a surface, which may possibly be caused by the presence of minute amounts of contaminants and the like, may be compensated for or even overcompensated by performing the treatment 104 in situ.

Figure 1F:
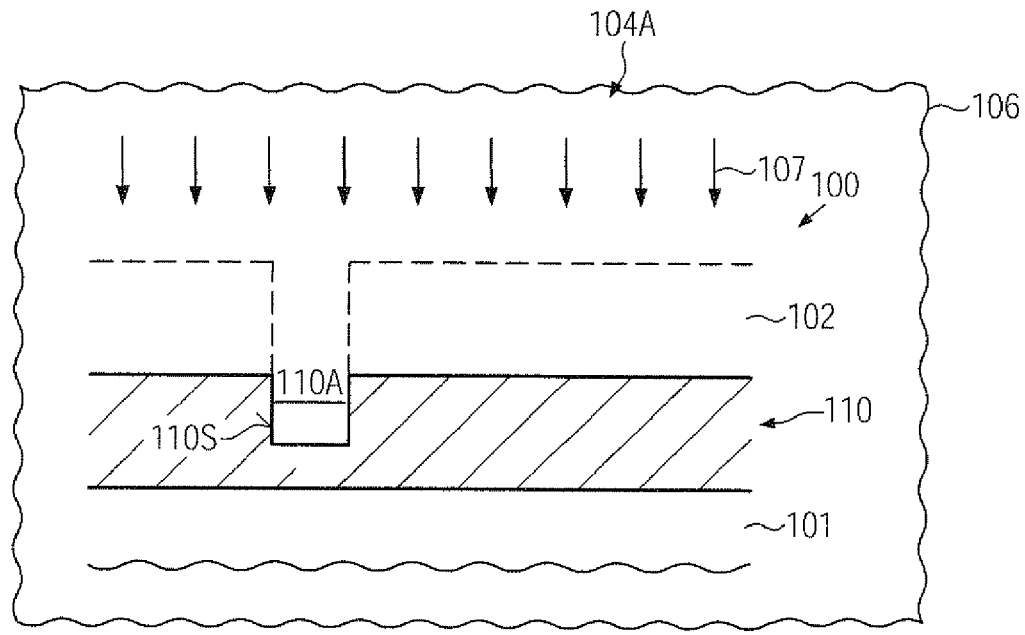
FIGS. 1f-1g schematically illustrate cross-sectional views of the microstructure device according to still other illustrative embodiments in which a further plasma-based treatment, such as the removal of an etch mask, may be performed in situ with a further surface treatment on the basis of hydrogen and carbon containing radicals.

FIG. 1f schematically illustrates the microstructure device 100 according to further illustrative embodiments in which a further reactive plasma ambient 107 may be established in an appropriate process environment 106, such as a process chamber and the like, wherein a certain type of radicals may be generated or may be supplied in order to remove material of the etch mask 102, thereby also interacting with the exposed surface area 110S within the opening 110A and with horizontal surface portions 110S after substantially completely removing the etch mask 102. For example, the etch ambient 107 may be established on the basis of oxygen radicals, for instance when performing a resist ashing process, or on the basis of any other etch chemistries, depending on the material composition of the etch mask 102. It should be appreciated that, in some illustrative embodiments, the process of patterning the material 110 may be performed on the basis of a process sequence as described above with reference to FIGS. 1b-1e, so that the exposed surface portions 110S within the opening 110A may have superior surface conditions with respect to the presence of methyl groups so that a corresponding degree of damage during the plasma assisted process 107 may be less pronounced. In this case, the formation of any polarizable functional groups may be significantly suppressed in an intermediate phase when the etch ambient 107 may be established in a different process environment compared to the process environment 105 (FIG. 1b) for patterning the material 110. In other illustrative embodiments, the patterning of the material 110 and the removal of any mask materials, such as the etch mask 102, may be accomplished in a single process environment in which the process 107 may represent a final phase of the overall patterning process. Also, in this case, an intermediate treatment in the form of the plasma ambient 104 as described with reference to FIGS. 1d-1e may be performed, if desired, in order to reduce any surface damage prior to continuing the overall patterning sequence on the basis of the etch process 107.

Figure 1G:
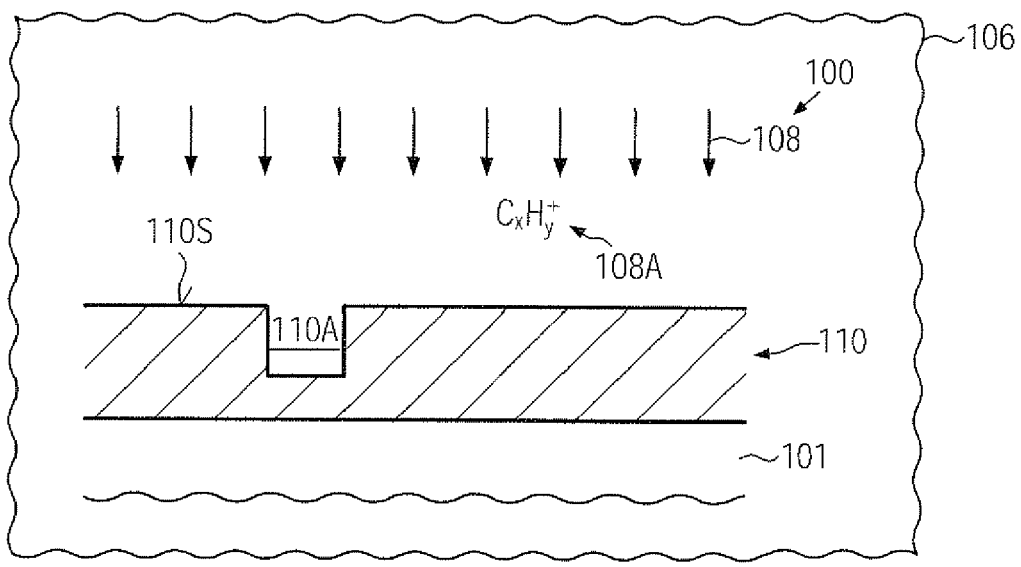

FIG. 1g schematically illustrates the microstructure device 100 when exposed to a surface treatment 108 on the basis of carbon and hydrogen containing radicals 108A in order to re-establish or establish a hydrophobic surface structure. The treatment 108 may, in some illustrative embodiments, be performed in the same process environment 106, thereby obtaining a highly efficient overall manufacturing sequence, while also avoiding the presence of undesired species, such as water vapor and the like. Consequently, the entire surface area exposed during the preceding process 107 of FIG. 1f may react with the radicals 108A, thereby creating a significant amount of methyl groups, as previously explained.

It should be appreciated that one or more in situ treatments, such as the plasma treatments 104, 108 of FIGS. 1d and 1g, respectively, may be applied during the entire sequence of depositing and patterning the dielectric material 110, wherein, in some illustrative embodiments, a corresponding in situ plasma treatment may be performed twice or more, depending on the overall complexity of the overall process sequence for forming and patterning the material 110. It should be further appreciated that the in situ treatments 104, 108 may be combined with other additional surface treatments, such as separately performed plasma treatments, if considered appropriate. For example, after depositing the dielectric material 110 and treating the material so as to impart the desired characteristics to the deposited material, for instance in the form of creating nano pores and the like, a plasma treatment on the basis of a hydrogen and carbon containing species may be applied in order to further enhance the overall surface characteristics. Similarly, a corresponding plasma treatment may be performed after contact of the dielectric material 110 with aggressive wet chemical or cleaning processes in order to re-establish the desired hydrophobic surface structure. In this case, in combination with the in situ processes applied at least during the patterning of the dielectric material 110, in total, a significantly improved hydrophobic nature and thus a reduced dielectric constant of the surface area 110S may be accomplished.

Figure 1H:
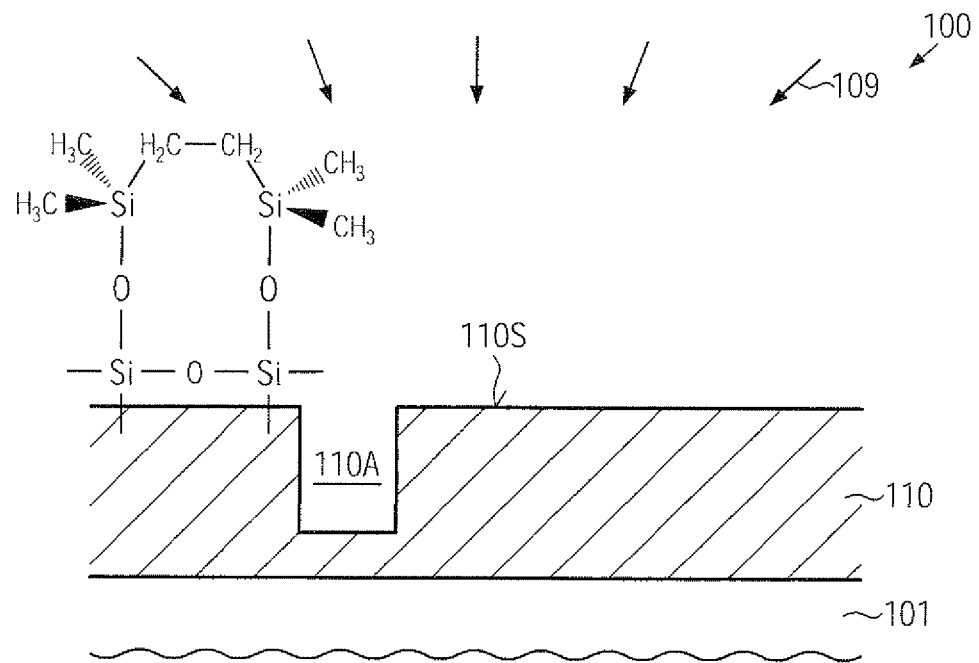
FIG. 1h schematically illustrates the microstructure device in a further advanced process stage in which, in addition to one or more previously performed plasma-based treatments for re-establishing a hydrophobic surface structure, a cross-linking may be initialized, such as a polymerization, according to still further illustrative embodiments.

FIG. 1h schematically illustrates the microstructure device 100 according to still further illustrative embodiments in which the dielectric material 110 may be exposed to a process ambient 109 in which chemicals may be supplied to the surface 110S that may connect thereto and may provide the possibility of creating cross-links, for instance in the form of a polymerized material. For this purpose, in some illustrative embodiments, silane and any derivatives thereof, may be used in combination with an appropriate functional group, such as a vinyl group, a phenyl group and the like. For example, divinyltetramethyl-disilazane may be efficiently used during the process 109 in order to form a surface layer which, upon reacting with remaining or newly created silanol groups, may result in the formation of cross-links, thereby imparting superior chemical stability to the surface 110S. For example, as illustrated in FIG. 1h, a cross-linking may be accomplished by means of corresponding C—C bonds so that a polymerized surface layer may be provided. Consequently, after providing the surface structure on the basis of at least one in situ plasma treatment, as described above, in some illustrative embodiments, the state of the surface 110S may be further enhanced by forming a cross-linked surface layer on the basis of the process 109.

Figure 1I:
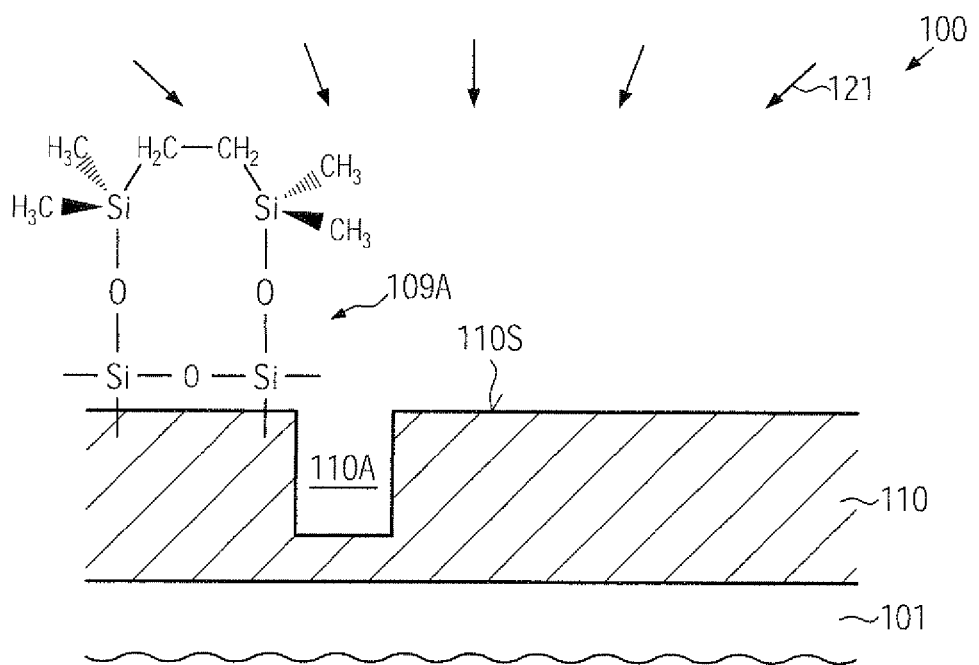
FIG. 1i schematically illustrates the microstructure device when exposed to a reactive etch ambient, such as a wet chemical cleaning process performed on the basis of the polymerized surface structure having the superior chemical stability, according to illustrative embodiments.

FIG. 1i schematically illustrates the microstructure 100 when exposed to a further process 121 in which a cross-linked species, such as a polymerized surface material 109A, may provide enhanced stability, thereby maintaining the hydrophobic nature of the surface 110S to a certain degree. For example, the treatment 121 may represent a wet chemical cleaning process which may be performed immediately prior to the deposition of any further materials, such as a conductive barrier material and the like.

Figure 1J:
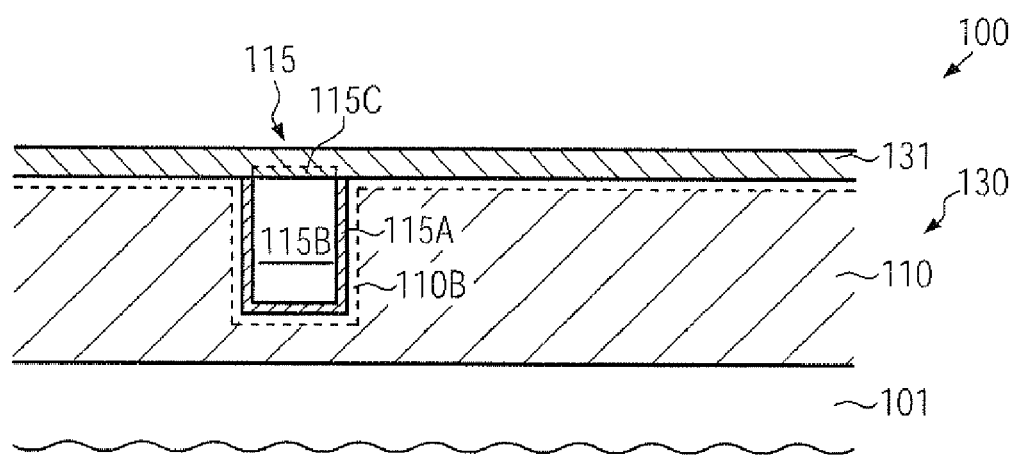
FIG. 1j schematically illustrates a cross-sectional view of the microstructure device in a further advanced manufacturing stage in which a metal region may be formed in the low-k dielectric material, wherein an interface area has a desired low dielectric constant, according to illustrative embodiments.

FIG. 1j schematically illustrates the microstructure device in a further advanced manufacturing stage. As illustrated, a conductive region 115 may be formed in the low-k dielectric material 110, which, in some illustrative embodiments, may represent a metal line of a metallization system 130 of the device 100. For example, the conductive region 115 may comprise a core material 115B, such as a highly conductive metal, for instance in the form of copper, a copper alloy, silver, aluminum and the like. As previously explained, frequently, a reliable confinement of the core material 115B may be required, which may be accomplished by using a conductive barrier material 115A, such as tantalum, tantalum nitride, ruthenium, titanium, titanium nitride and the like. Furthermore, in some illustrative embodiments, the core material 151B may be capped by a conductive cap layer 115C, which may be provided in the form of any appropriate metal or alloy, which may provide superior copper confinement in combination with a desired high resistance with respect to electromigration effects. Furthermore, the conductive regions 115 may be embedded in the dielectric material 110, thereby forming an interface layer 110B, which may have a substantially hydrophobic nature and which may thus have a reduced dielectric constant due to the previous at least one in situ plasma treatment. Hence, the overall relative permittivity of the material 110 may not be unduly increased at the interface layer 110B during the preceding patterning of the dielectric material 110. For example, for otherwise identical device configurations and process techniques, one in situ plasma treatment, as previously described, may result in an increase of performance of the metallization system 130, for instance with respect to signal propagation delay, by approximately two percent compared to a device having the dielectric material 110 in a non-treated state. In other cases, the overall performance of the metallization system 130 may be even further enhanced by incorporating two or more in situ plasma treatments during the overall manufacturing sequence for patterning the dielectric material 110 and forming the conductive region 115 therein.

Furthermore, as shown, a dielectric cap or etch stop material 131 may be formed above the dielectric material 110 and the conductive region 115 and may represent an appropriate platform for forming additional metallization levels above the dielectric material 110.

The device 100 may be formed on the basis of any appropriate process techniques, which may include the deposition of the barrier material 115A, if required, followed by any appropriate material deposition technique, possibly in combination with the deposition of a seed material, in order to provide the core material 115B. For example, electrochemical deposition techniques may be used for this purpose. If required, the conductive cap material 115C may be formed, for instance, by electrochemical deposition techniques, followed by the deposition of the material 131. It should be appreciated that, in some illustrative embodiments, the material 131 may be deposited on the basis of a plasma enhanced deposition recipe. In this case, the exposed surface of the dielectric material 110 may be exposed to a hydrogen and carbon containing plasma ambient, for instance in the form of an in situ process sequence with the subsequent deposition process, thereby even further improving the overall surface structure of the material 110, which may have been damaged during the preceding processes, for instance when removing any excess material of the barrier material 115A and the core material 115B.

As a result, the present disclosure provides techniques for establishing or re-establishing a high degree of hydrophobic nature of exposed surface areas of a silicon and oxygen containing low-k dielectric material by applying at least one in situ plasma process sequence during which a contact with hydrogen and carbon containing radicals may be initiated in order to create corresponding methyl groups at the exposed surface areas. Consequently, the low-k dielectric material may be obtained with the desired surface characteristics after a reactive plasma process sequence, which may include the patterning of the low-k dielectric material, the deposition thereof, the deposition of any further dielectric materials on the low-k dielectric material, the removal of any etch masks and the like. Consequently, the electrical performance of sophisticated metallization systems of semiconductor devices or other microstructures may be significantly enhanced, for instance, when metal regions are to be provided having lateral dimensions of several hundred nanometers and less with a spacing between two adjacent metal lines of the same order of magnitude. In some illustrative embodiments, the efficiency of the in situ plasma treatment may be even further enhanced by contacting the surface with chemicals having cross-linking capabilities in order to obtain a polymerized surface area that may provide enhanced stability during the further processing.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a silicon, carbon and oxygen containing dielectric material above a substrate of a microstructure device;
    establishing a first plasma ambient in a process environment that is configured to confine a plasma;
    exposing a surface portion of said silicon, carbon and oxygen containing dielectric material to a first type of radicals generated in said first plasma ambient;
    establishing a second plasma ambient based on hydrogen and carbon in said process environment; and
    exposing said surface portion of said silicon, carbon and oxygen containing dielectric material to a second type of radicals generated in said second plasma ambient, said second type of radicals providing forming methyl groups in a surface structure on said surface portion.

2. The method of claim 1, wherein said second type of radicals comprises hydrogen and carbon.

3. The method of claim 2, wherein said second type of radicals consist of hydrogen and carbon.

4. The method of claim 1, wherein said silicon, carbon and oxygen containing dielectric material is formed so as to have a dielectric constant of approximately 3.0 or less.

5. The method of claim 1, wherein said silicon, carbon and oxygen containing dielectric material is formed so as to have a porous structure.

6. The method of claim 1, wherein said first type of radicals generated in said first plasma ambient is selected so as to remove material of said silicon, carbon and oxygen containing dielectric layer.

7. The method of claim 1, wherein said first type of radicals generated in said first plasma ambient is selected so as to remove material of an etch mask formed above said silicon, carbon and oxygen containing dielectric layer.

8. The method of claim 1, wherein said first type of radicals generated in said first plasma ambient is selected so as to deposit material of said silicon, carbon and oxygen containing dielectric material.

9. The method of claim 1, further comprising establishing a third plasma ambient in a second process environment configured to confine a plasma, exposing said surface portion to said first type of radicals generated in said third plasma ambient, establishing a fourth plasma ambient in said second process environment and exposing said surface portion to said second type of radicals generated in said fourth plasma ambient.

10. The method of claim 1, further comprising initiating one of a dimerization and a polymerization reaction by supplying one or more chemical reagents to said surface portion so as to increase chemical stability of said surface portion.

11. The method of claim 10, wherein said one or more chemical reagents are supplied in said process environment.

12. The method of claim 10, wherein said one or more chemical reagents are supplied external to said process environment.

13. The method of claim 10, wherein said one or more chemical reagents comprise at least one of silane, trimethyl silane, tetramethyl silane and tetramethyldisilazane in combination with one or more functional groups.

14. The method of claim 13, wherein said one or more functional groups comprise a vinyl group.

15. The method of claim 1, wherein said silicon, carbon and oxygen containing dielectric material is a dielectric material of a metallization system of said microstructure device.

16. The method of claim 10, further comprising performing a wet chemical cleaning process after increasing the chemical stability of said surface portion.

17. A method of forming a low-k dielectric material in a microstructure device, the method comprising:
    forming a silicon, carbon and oxygen containing dielectric material above a substrate so as to have a dielectric constant of approximately 3.0 or less, said silicon, carbon and oxygen containing dielectric material having a surface including methyl groups;
    patterning said silicon, carbon and oxygen containing dielectric material by exposing at least a part of said silicon, carbon and oxygen containing dielectric material to a first type of radicals in a process environment configured to confine a plasma ambient; and exposing an exposed surface area to a second type of radicals in said process environment, said second type of radicals generating methyl groups in said surface.

18. The method of claim 17, wherein said second type of radicals comprises hydrogen and carbon.

19. The method of claim 17, further comprising performing a treatment for forming cross-links in said surface by supplying one or more chemical reagents after exposing the exposed surface area to the second type of radicals in said process environment.

20. The method of claim 19, wherein said one or more chemical reagents comprise at least one of silane, trimethyl silane, tetramethyl silane and tetramethyldisilazane in combination with a functional group for initiating one of dimerization and polymerization.

21. The method of claim 20, wherein said functional groups comprise a vinyl group.

22. A method, comprising:

forming a low-k dielectric material above a substrate of a semiconductor device, said low-k dielectric material comprising silicon and oxygen;

forming a trench in said low-k dielectric material by performing a plasma assisted etch process in a process chamber;

generating hydrogen and carbon containing radicals in said process chamber so as to create methyl groups in exposed surface portions of said low-k dielectric material; and forming a metal line on the basis of said trench.

23. The method of claim 22, further comprising exposing at least a portion of said low-k dielectric material to hydrogen and carbon containing radicals after creating said methyl groups.

24. The method of claim 23, wherein said at least a portion is exposed to said hydrogen and carbon containing radicals prior to forming said metal line.

25. The method of claim 22, further comprising performing a treatment for forming cross-links in said surface portions by supplying one or more chemical reagents to said surface portions.

* * * * *